United States Patent [19]
Son et al.

[11] Patent Number: 6,069,056
[45] Date of Patent: May 30, 2000

[54] METHOD OF FORMING ISOLATION STRUCTURE

[75] Inventors: Jeong Hwan Son, Daejon; Jong Kwan Kim, Cheongju, both of Rep. of Korea

[73] Assignee: LG Semicon Co., Ltd., Cheongju, Rep. of Korea

[21] Appl. No.: 08/998,828

[22] Filed: Dec. 29, 1997

[30] Foreign Application Priority Data

Mar. 18, 1997 [KR] Rep. of Korea .................... 97/9086

[51] Int. Cl.[7] .................................................. H01L 21/76
[52] U.S. Cl. .................................... 438/424; 438/757
[58] Field of Search ................................. 438/424, 427, 438/757

[56] References Cited

U.S. PATENT DOCUMENTS

| | | |
|---|---|---|
| 5,310,457 | 5/1994 | Ziger ........................................ 438/757 |
| 5,498,565 | 3/1996 | Gocho et al. . |
| 5,565,376 | 10/1996 | Lur et al. ................................. 438/427 |
| 5,721,173 | 2/1998 | Yano et al. ............................. 438/424 |
| 5,880,007 | 3/1999 | Varian et al. ........................... 438/427 |

*Primary Examiner*—Olik Chaudhuri
*Assistant Examiner*—Anh Duy Mai

[57] ABSTRACT

A method of forming an isolation region of a semiconductor device, includes the steps of forming a first insulating film on a substrate; defining a plurality of isolation regions on the first insulating film; removing portions of the first insulating film in the isolation regions to expose portions of the substrate; selectively removing the exposed portions of the substrate to form at least one trench; forming a second insulating film in the at least one trench and on portions of the first insulating film; and removing the first insulating film so as to remove the second insulating film formed thereon.

21 Claims, 4 Drawing Sheets

METHOD OF FORMING ISOLATION STRUCTURE

BACKGROUND OF THE INVENTION

1. Field of the Invention

The present invention relates to a method of forming an isolation structure, and more particularly, to a method of forming a trench isolation structure in a semiconductor memory device.

2. Description of the Related Art

In a conventional semiconductor memory device, a trench isolation structure is used for inter-de-vice isolation. Such a structure does not encroach upon a channel width of the semiconductor memory device, so that the size of the semiconductor memory device can he reduced. The trench isolation structure also can prevent a latch-up in a CMOS device, improving the characteristics of the semiconductor memory device.

Using a conventional method, a uniform trench isolation structure is formed. A conventional trench isolation structure as shown in FIG. 1E includes a plurality of trenches 41, 42 and 43 formed on a semiconductor substrate 1, and burying materials 5a, 5b and 5c filled in the trenches 41, 42 and 43, respectively.

FIGS. 1A–1E show views illustrating a convention method of forming a trench isolation structure.

As shown in FIG. 1A, a pad oxide film 21, a polysilicon film 22, and a silicon nitride film 23 are sequentially formed on the semiconductor substrate 1 to serve as an etch stop layer and a polishing stop layer. Then the trenches 41, 42, and 43 are formed on the upper portion of the semiconductor substrate 1. Using a chemical vapor deposition (CVD), first, second and third silicon oxides 5a, 5b and 5c are respectfully filled in the trenches 41–43 and fourth through seventh silicon oxides 5d, 5e, 5f, and 5g are formed on the silicon nitride film 23 between the trenches 41–43.

To planarize the semiconductor substrate 1 shown in FIG. 1A, a chemical mechanical polishing (CMP) is performed on the entire upper surface of the semiconductor substrate 1. However, because the fourth silicon oxide 5d is wider than the fifth through seventh silicon oxides 5e–5g, a longer CMP process time is required to completely remove such silicon oxides.

As shown in FIG. 1B, in order to decrease the CMP process time required to remove the fourth silicon oxide 5d, a photoresist pattern 3 is formed on portions of the fourth silicon oxide 5d and over the other silicon oxides. Using the photoresist pattern 3, isotropic etching is performed to remove a central portion of the fourth silicon oxide 5d. As a result, marginal portions 50 of the fourth silicon oxide 5d remain as shown in FIG. 1C. In the isotropic etching process, 1/40 diluted hydrofluoric acid is used. In using the diluted hydrofluoric acid for etching, an etching speed ratio of the silicon oxide 5d and the silicon nitride film 23 is about 8:1.

As shown in FIG. 1D, the marginal portions 50 and fifth through seventh silicon oxides 5e–5g are completely removed by a CMP or an etchback using dry etching. Here, since the polishing speed ratio of the silicon oxides 5e–5g and 50 and the silicon nitride film 23 is about 5:1, the silicon nitride film 23 can he stably used as a polishing stopper. The silicon oxides 5e–5g serve as a burying material.

Then as shown in FIG. 1E, the silicon nitride film 23 is removed by a reactive ion etching (RIE) using a $C_4F_8$ gas or by a wet etching using a hot phosphoric acid. The polysilicon film 22 is removed by a KOH solution and the pad oxide film 21 is removed by a hydrofluoric acid. As a result, the semiconductor substrate 1 having the trench isolation structure is fabricated.

However, the conventional method requires a complicated processing, such as, removing the silicon nitride film 23 after the CMP process. Further, during the CMP process, contamination of the semiconductor substrate 1 occurs.

SUMMARY OF THE INVENTION

Accordingly, it is an object of the present invention to provide a trench isolation method which employs a lift-off process, instead of a CMP process, which eliminates the complicated process of removing a silicon nitride film, avoids contamination of a semiconductor substrate, and overcomes other problems encountered in the conventional methods.

To achieve the above and other objects, there is provided a method of forming an isolation region of a semiconductor device, including the steps of forming a first insulating film on a substrate; defining a plurality of isolation regions on the first insulating film; removing portions of the first insulating film in the isolation regions to expose -portions of the substrate; selectively removing the exposed portions of the substrate to form at least one trench; forming a second insulating film in the at least one trench and on portions of the first insulating film; and removing the first insulating film to remove the second insulating film formed thereon.

These and other objects of the present application will become more readily apparent from the detailed description given hereinafter. However, it should he understood that the detailed description and specific examples, while indicating preferred embodiments of the invention, are given by way of illustration only, since various changes and modifications within the spirit of and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

A description of the present invention will now be given with reference to the accompanying drawings.

Figure 1A:
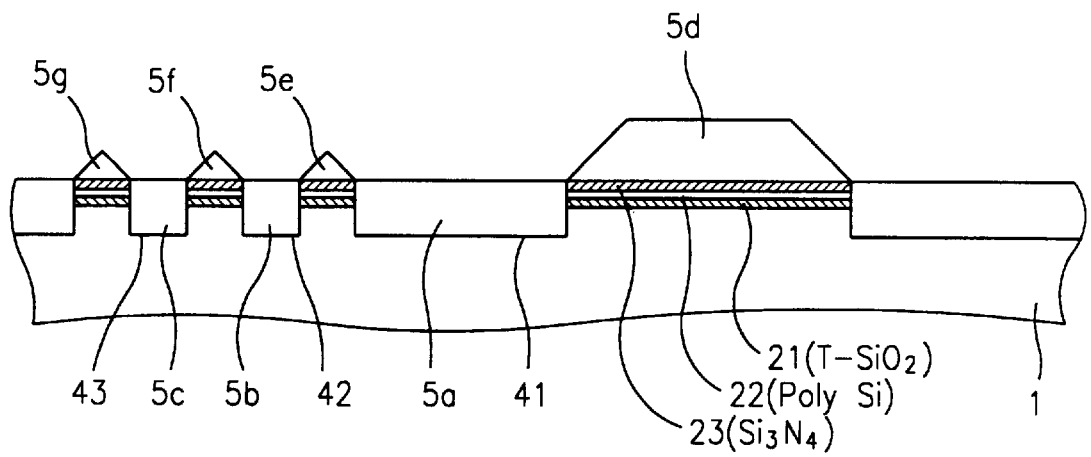
FIGS. 1A through 1E are views for explaining a conventional method of forming a trench isolation structure.
Figure 1B:
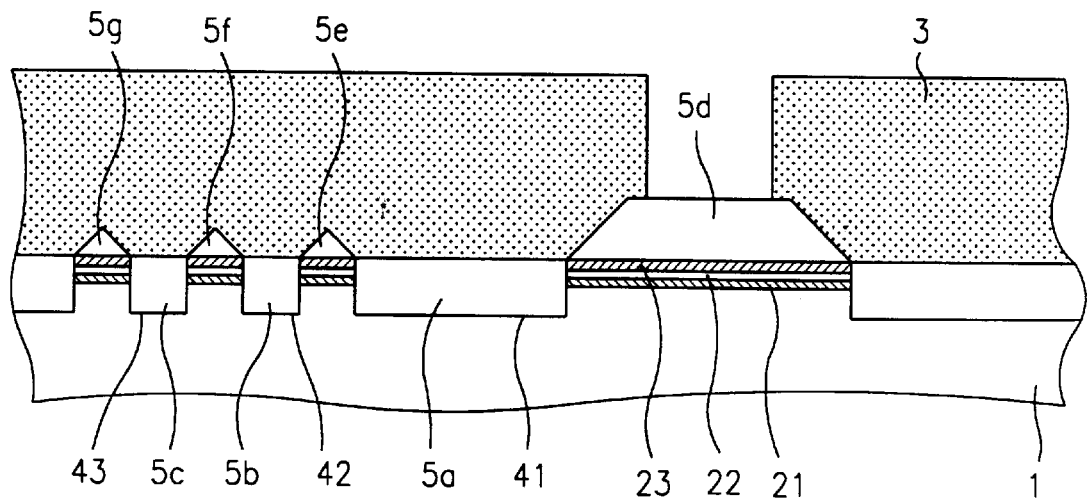
Figure 1C:
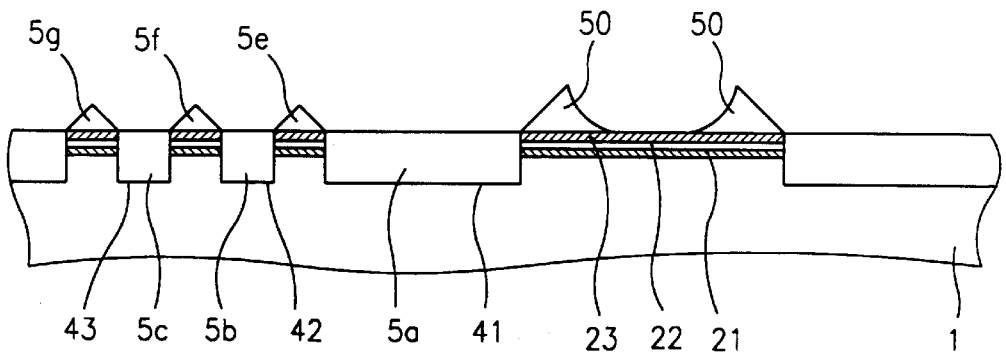
Figure 1D:
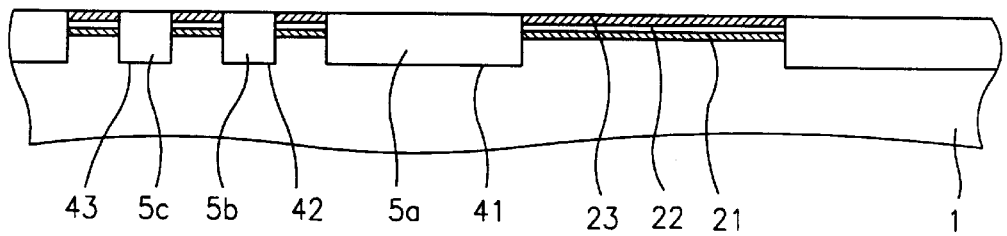
Figure 1E:
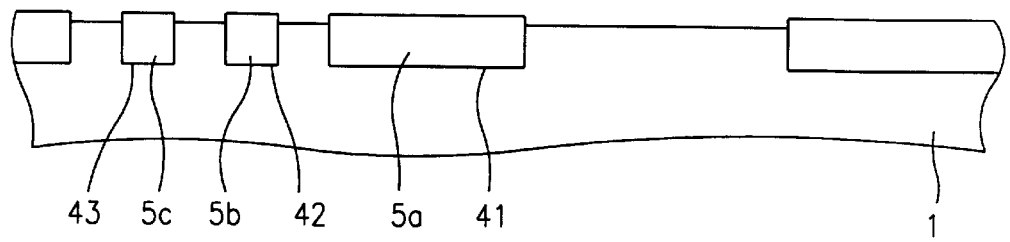
Figure 2A:
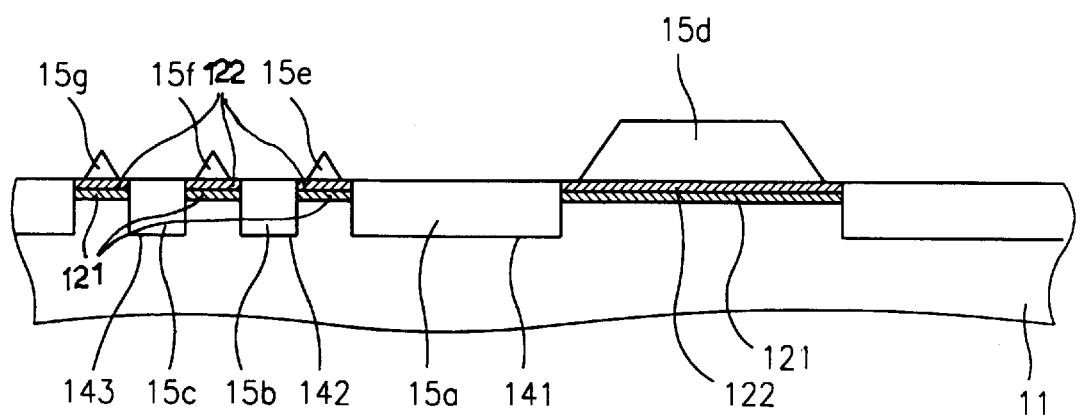
FIGS. 2A through 2E are views for explaining a method of forming an isolation structure according to the embodiments of the present invention.

According to the embodiments of the present invention, a method of forming an isolation structure in a semiconductor memory device, as shown in FIG. 2A, includes the step of forming a pad oxide film (T-$SiO_2$) 121 on a semiconductor substrate 11 and a silicon nitride film ($Si_3N_4$) 122 on the pad oxide film 121. The pad oxide film 121 and silicon nitride film 122 serve as an etch stop layer. Then the pad oxide film 121 and the silicon nitride film 122 are selectively removed to expose portions of the semiconductor substrate 11 and to define a plurality of isolation regions. The exposed portions of the semiconductor substrate 11 are removed to form a plurality of trenches 141, 142, and 143 on an upper portion of the semiconductor substrate 11.

First through third silicon oxides 15a, 15b, and 15c are filled in the trenches 141–143, respectively, by a high density plasma chemical vapor deposition (HDP CVD) in which etching and deposition processes for silicon oxide are performed simultaneously on the trenches 141–143. The silicon oxide which fills the trenches 141–143 is also formed on portions of the upper surface of the silicon nitride film 122 as fourth through seventh silicon oxide 15d, 15e, 15f, and 15g. It is important that the fourth through seventh silicon oxides 15d–15g do not completely cover the portions of the silicon nitride film 122. The reason for this is that if the silicon nitride film 122 were completely covered with the fourth through seventh silicon oxides 15d–15g, when the wet etching is performed on the silicon nitride film 122 the silicon oxide prevents an etching solution from reacting with the silicon nitride film 122. Consequently, a lift-off process cannot be performed. Therefore, process variables are adjusted not to form silicon oxides completely over the silicon nitride film 122.

The silicon nitride film 122 is used as an etch stop layer because the difference between the respective etching speeds of the silicon nitride film 122 and the silicon oxides 15a–15c is large. That is, as described hereinabove in connection with the conventional method, when the hydrofluoric acid is used for etching, the etch selectivity between the silicon nitride film 122 and the first through third silicon oxides 15a–15c is about 1:8. This enables the silicon nitride film 122 to he used as the etch stop layer.

Figure 2B:
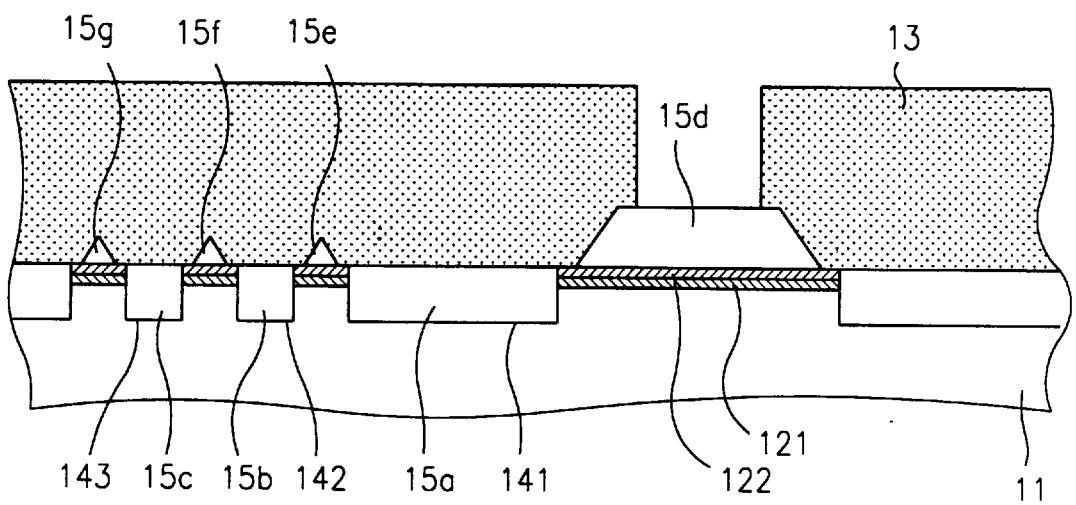
Figure 2C:
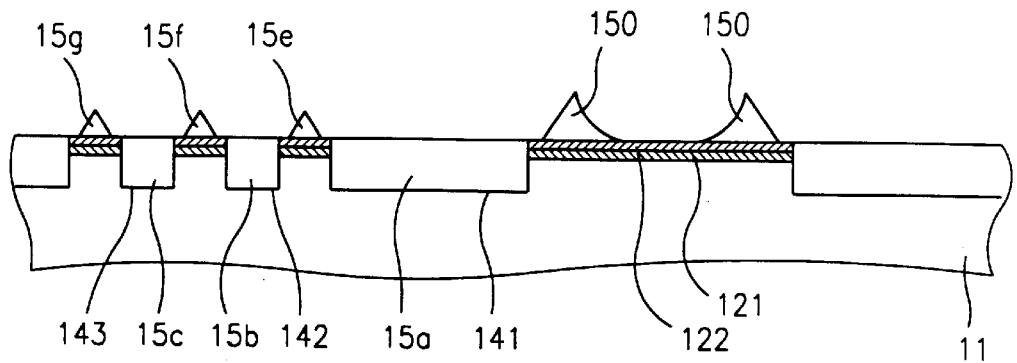
Figure 2D:
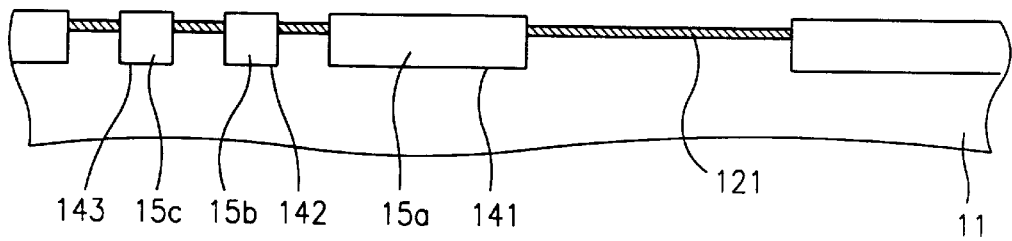

As shown in FIG. 2B, a photoresist pattern 13 is formed to cover all the layers formed on the semiconductor substrate 1, except the central portion of the fourth silicon oxide 15d. Using the photoresist pattern 13 as a mask, an isotropic etching is performed to pattern the fourth silicon oxide 15d into marginal portions 150, as shown in FIG. 2C. Then, the semiconductor substrate 11 is placed in a nitric acid solution so that the nitric acid and the silicon nitride film 122 react with each other. This reaction removes the silicon nitride film 122, resulting in the removal (or lifting) of the marginal portions 150 and fifth through seventh silicon oxides 15e–15g. This process is called a "lift-off". FIG. 2D shows the surface of the semiconductor substrate 11 after the lift-off.

Figure 2E:
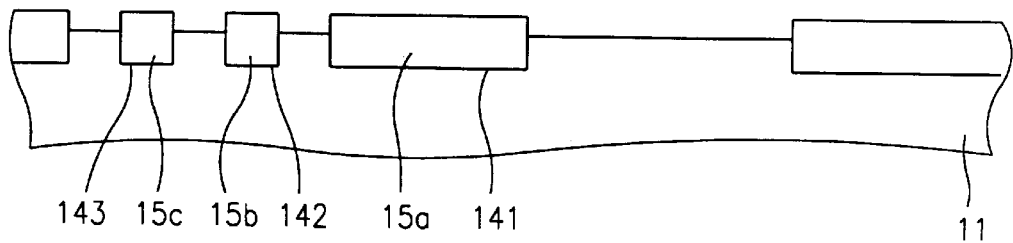

As shown in FIG. 2E, the pad oxide film 121 is completely etched from the semiconductor substrate 1 to complete the trench isolation process.

The present invention described above has advantages in that a simple process (e.g., a lift-off can be embodied and the contamination of the semiconductor substrate can be reduced to enhance the productivity in a semiconductor fabrication process.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method of forming an isolation region of a semiconductor device, comprising the steps of:

forming a first insulating film on a substrate;

defining a plurality of isolation regions on the first insulating film;

removing portions of the first insulating film in the isolation regions to expose portions of the substrate;

selectively removing the exposed portions of the substrate to form at least one trench;

forming a second insulating film in the at least one trench and on portions of the first insulating film such that parts of the first insulating film remain exposed; and removing the first insulating film to remove the second insulating film formed thereon.

2. The method of claim 1, wherein the step of removing the first insulating film includes the step of:

removing the first insulating film from the substrate via the exposed portions of the first insulating film to automatically separate the second insulating film from the substrate.

3. The method of claim 1, wherein the step of forming a first insulating film includes at least one of the steps of:

forming a pad oxide film on the substrate; and forming a silicon nitride film over said pad oxide film.

4. The method of claim 3, wherein the forming the second insulating film step forms the second insulating film such that portions of the silicon nitride film are exposed.

5. The method of claim 4, wherein the step of removing the first insulating film includes the step of:

placing the substrate in a nitric acid solution to remove the first and second insulating films from the substrate at a substantially same time.

6. The method of claim 1, wherein the step of forming a second insulating film includes the steps of:

filling the at least one trench with one silicon oxide, and covering the portions of the first insulating film with silicon oxide.

7. The method of claim 6, wherein the step of forming a second insulating film further includes the steps of:

forming a photoresist pattern layer over the substrate to expose a portion of the second silicon oxide layer, and selectively removing a central portion of the second silicon oxide layer using the photoresist pattern layer to form marginal silicon oxide portions on the first insulating film.

8. The method of claim 1, wherein the step of forming a second insulating film is performed by a high density plasma chemical vapor deposition (HDP CVD).

9. The method of claim 1, wherein the step of forming a second insulating film includes the seep of:

performing an etching process and a depositing process, simultaneously.

10. The method of claim 1, wherein the step of removing the first insulating film includes the step of:

performing a lift-off process.

11. The method of claim 1, wherein the step of removing the first insulating film includes the step of:

removing the first and second insulating films, simultaneously.

12. A method of forming an isolation structure, comprising the steps of:

forming an insulating pattern on a substrate;

forming a trench by removing a portion of the substrate using the insulating pattern as a mask;

forming an insulating film in the trench and on a portion of the insulating pattern such that parts of the insulating pattern remain exposed; and removing the insulating pattern or to remove the insulating film so as to form an isolation structure.

13. The method of claim 12, wherein the stem of forming an insulating pattern includes the steps of:

forming a pad oxide film on the substrate, and forming a silicon nitride film over the pad oxide film.

14. The method of claim 13, wherein the forming an insulating film step forms the insulating film such that portions of the silicon nitride film remain exposed.

15. The method of claim 14, wherein the step of removing the insulating pattern includes the step of:

placing the substrate in a nitric acid solution to remove the insulating film and insulating pattern from the substrate at a substantially same time.

16. The method of claim 12, wherein the step of forming an insulating film includes the steps of:

filling the trench with silicon oxide, and covering the portion of the insulating pattern with silicon oxide.

17. The method of claim 15, wherein the step of forming an insulating film further includes the steps of:

forming a photoresist pattern layer over the substrate to expose a portion of the second silicon oxide layer, and selectively removing a central portion of the second silicon oxide layer to form marginal silicon oxide portions on the insulating pattern.

18. The method of claim 12, wherein the step of forming an insulating film is performed by a high density plasma chemical vapor deposition (HDP CVD).

19. The method of claim 12, wherein the step of forming an insulating film includes the step of:

performing an etching process and a depositing process, simultaneously.

20. The method of claim 12, wherein the step of removing the insulating pattern includes the step of:

performing a lift-off process.

21. The method of claim 12, wherein the step removing the insulating pattern includes the step of:

removing the insulating pattern and the insulating film, simultaneously.

* * * * *